United States Patent
Chow et al.

(10) Patent No.: US 8,304,880 B2
(45) Date of Patent: Nov. 6, 2012

(54) INTEGRATED CIRCUIT PACKAGING SYSTEM WITH PACKAGE-ON-PACKAGE AND METHOD OF MANUFACTURE THEREOF

(75) Inventors: Seng Guan Chow, Singapore (SG); Hin Hwa Goh, Singapore (SG); Rui Huang, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 82 days.

(21) Appl. No.: 12/881,983

(22) Filed: Sep. 14, 2010

(65) Prior Publication Data

US 2012/0061854 A1   Mar. 15, 2012

(51) Int. Cl.
 *H01L 23/02*   (2006.01)
(52) U.S. Cl. ........... 257/686; 257/E25.018; 257/685; 257/777; 438/108; 438/109; 361/760
(58) Field of Classification Search ........... 257/E25.013, 257/E25.018, 685, 686, 723, 777, 778; 438/108, 438/109; 361/760
See application file for complete search history.

(56) References Cited

U.S. PATENT DOCUMENTS

| | | | | |
|---|---|---|---|---|
| 5,222,014 A * | 6/1993 | Lin | | 361/792 |
| 6,229,215 B1 | 5/2001 | Egawa | | |
| 6,404,062 B1 | 6/2002 | Taniguchi et al. | | |
| 6,493,229 B2 * | 12/2002 | Akram et al. | | 361/704 |
| 7,061,087 B2 * | 6/2006 | Kim | | 257/686 |
| 7,138,709 B2 * | 11/2006 | Kumamoto | | 257/686 |
| 7,230,329 B2 * | 6/2007 | Sawamoto et al. | | 257/686 |
| 7,279,789 B2 * | 10/2007 | Cheng | | 257/713 |
| 7,432,602 B2 | 10/2008 | Kuramochi | | |
| 7,619,305 B2 | 11/2009 | Fan et al. | | |
| 7,737,539 B2 * | 6/2010 | Kwon et al. | | 257/686 |
| 7,829,992 B2 * | 11/2010 | Sugino et al. | | 257/686 |
| 7,855,443 B2 * | 12/2010 | Tsai et al. | | 257/686 |
| 7,982,306 B1 * | 7/2011 | Yoshida et al. | | 257/698 |
| 2003/0197260 A1 * | 10/2003 | Nishimura et al. | | 257/686 |
| 2005/0184377 A1 * | 8/2005 | Takeuchi et al. | | 257/686 |
| 2007/0057357 A1 * | 3/2007 | Chen | | 257/686 |
| 2009/0127688 A1 * | 5/2009 | Lee et al. | | 257/686 |
| 2010/0123235 A1 | 5/2010 | Kim et al. | | |

* cited by examiner

*Primary Examiner* — Chris Chu
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a bottom substrate; mounting a bottom integrated circuit over the bottom substrate; mounting a top substrate over a side of the bottom integrated circuit opposite the bottom substrate; connecting a top interconnect between the bottom substrate and the top substrate; and forming an underfill layer between the bottom substrate and the top substrate, the underfill layer encapsulating the top interconnect outside a perimeter of the bottom integrated circuit.

20 Claims, 7 Drawing Sheets

US 8,304,880 B2

INTEGRATED CIRCUIT PACKAGING SYSTEM WITH PACKAGE-ON-PACKAGE AND METHOD OF MANUFACTURE THEREOF

TECHNICAL FIELD

The present invention relates generally to an integrated circuit packaging system, and more particularly to a system for package-on-package.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for performance, integration, and cost reduction.

Thus, a need still remains for an integrated circuit packaging system providing improved chip interconnection, space savings, and low cost manufacturing. In view of the ever-increasing need to improve performance, integration, and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a bottom substrate; mounting a bottom integrated circuit over the bottom substrate; mounting a top substrate over a side of the bottom integrated circuit opposite the bottom substrate; connecting a top interconnect between the bottom substrate and the top substrate; and forming an underfill layer between the bottom substrate and the top substrate, the underfill layer encapsulating the top interconnect outside a perimeter of the bottom integrated circuit.

The present invention provides an integrated circuit packaging system, including: a bottom substrate; a bottom integrated circuit over the bottom substrate; a top substrate over a side of the bottom integrated circuit opposite the bottom substrate; a top interconnect between the bottom substrate and the top substrate; and an underfill layer between the bottom substrate and the top substrate, the underfill layer encapsulating the top interconnect, outside a perimeter of the bottom integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
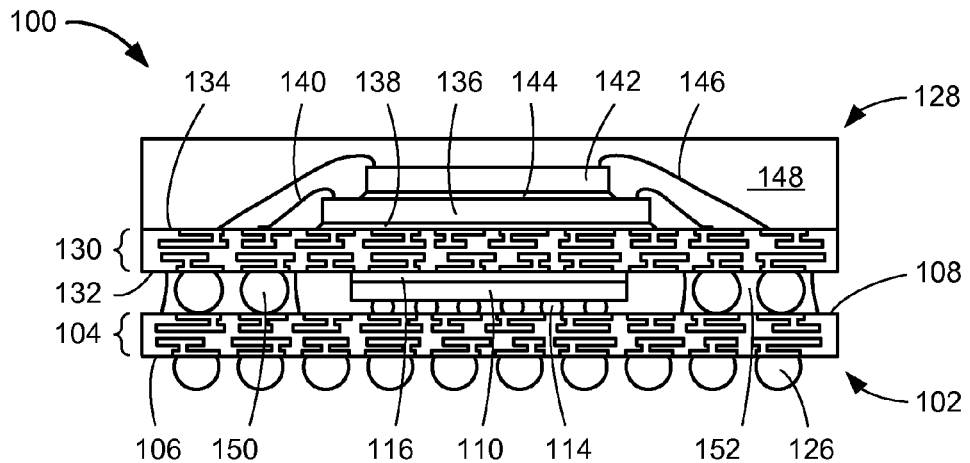
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

There are increasing expectations and requirements for semiconductor devices with better mechanical performance especially for hand held and portable device applications. Current package-on-package (PoP) structure having a top stacking package has solder interconnects (e.g. solder joints) that are directly exposed to environment without any reinforcement layer.

The solder interconnects might not be robust enough to cope with reliability test requirements, such as temperature cycling tests and/or mechanical impact tests. However, the package-on-package (PoP) structure is not amenable to introduction of a reinforcement layer in a package-to-package standoff gap particularly for package-on-package stacking structures having same size packages.

Furthermore, a long underfill overspread (or tongue) can be formed around a periphery of the current package-on-package (PoP) structure if a conventional dispensing technique is employed to provide an underfill in an inter-package standoff gap and a board-level mounting standoff gap of the package-on-package (PoP) structure. It is therefore disadvantageously found that material wastage is high, dispensing time for double-layer standoff gaps is long, and a large printed circuit board (PCB) keep-out zone is required to accommodate an underfill overspread.

In addition, thermal performance of a package-on-package (PoP) top package is another concern that needs to be addressed since peripheral balls might not be sufficient to dissipate heat through a bottom package substrate effectively. Embodiments of the present invention provide answers or solutions to these problems or concerns.

Figure 2:
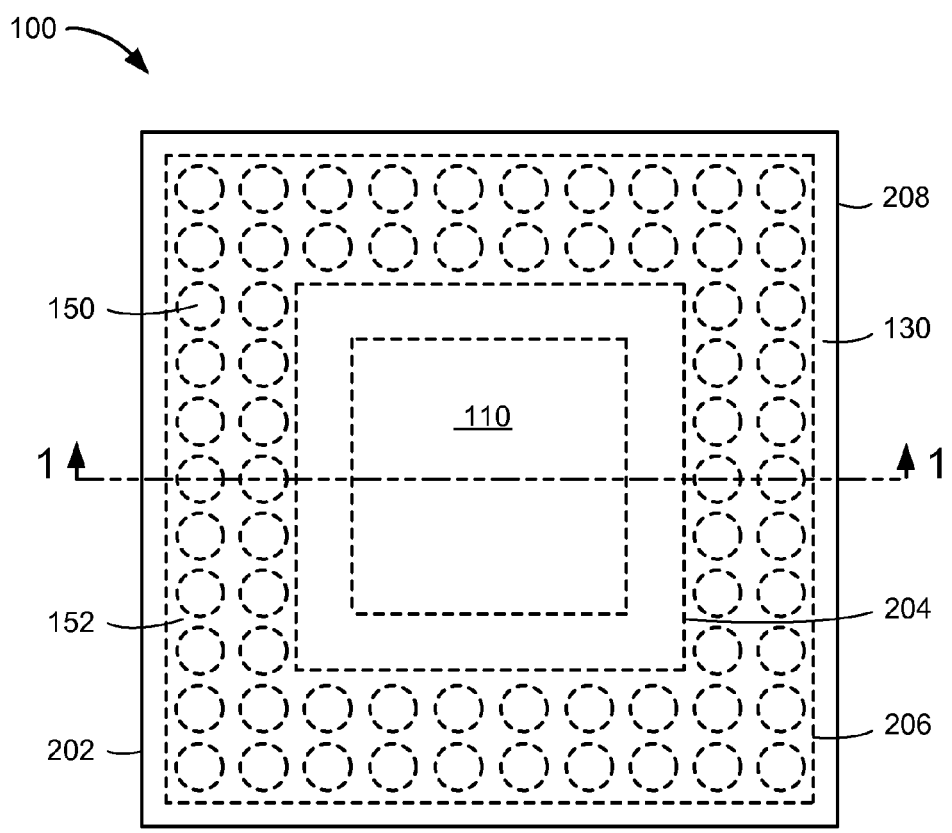
FIG. 2 is a top plan view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can include a bottom package 102, which is a semiconductor package. For example, the bottom package 102 can be a semiconductor package including a flip-chip package, a plastic encapsulated package, or a package-on-package bottom (PoPb) package.

The bottom package 102 can include a bottom substrate 104, which is a support structure for mounting and electrically connecting a semiconductor device thereto. The bottom substrate 104 can include a first bottom substrate side 106 and a second bottom substrate side 108 opposing the first bottom substrate side 106.

The bottom package 102 can include a bottom integrated circuit 110, which is a semiconductor device. The bottom integrated circuit 110 can be mounted over the second bottom substrate side 108. For illustrative purposes, the bottom integrated circuit 110 is shown as a flip chip, although it is understood that the bottom integrated circuit 110 can be any other semiconductor device.

The bottom package 102 can include a bottom connector 114, which is an electrical connector. The bottom connector 114 can electrically connect the second bottom substrate side 108 and the bottom integrated circuit 110. For illustrative purposes, the bottom connector 114 is shown as a conductive bump, although it is understood that the bottom connector 114 can be any other electrical connector.

The bottom package 102 can optionally include a thermal interface layer 116, which conducts heat away from the bottom integrated circuit 110. The thermal interface layer 116 can be a thermal joint or interface including a thermal interface material (TIM). The thermal interface layer 116 can be pre-applied on the bottom integrated circuit 110. The term pre-applied means that the thermal interface layer 116 is applied before the bottom integrated circuit 110 is mounted over the second bottom substrate side 108, another package is mounted over the bottom package 102, or a combination thereof.

The bottom package 102 can include a bottom interconnect 126, which is an electrical connector that provides electrical connectivity between the bottom substrate 104 and external systems (not shown). The bottom interconnect 126 can be attached to the first bottom substrate side 106.

The bottom interconnect 126 can be formed with a conductive material including solder or a metallic alloy. For example, the bottom interconnect 126 can be a solder ball or a bottom solder joint. For illustrative purposes, the bottom interconnect 126 is shown as a conductive ball, although it is understood that the bottom interconnect 126 can be any other electrical connector.

The integrated circuit packaging system 100 can include a top package 128, which is a semiconductor package. For example, the top package 128 can be a semiconductor package including a plastic encapsulated package, a flip-chip package, or a package-on-package top (PoPt) package.

The top package 128 can include a top substrate 130, which is a support structure for mounting and electrically connecting a semiconductor device thereto. The top substrate 130 can include a first top substrate side 132 and a second top substrate side 134 opposing the first top substrate side 132.

The top package 128 can include a first top integrated circuit 136, which is a semiconductor device. The first top integrated circuit 136 can be mounted over the second top substrate side 134. The top package 128 can include a first top attach layer 138, which attaches the second top substrate side 134 and the first top integrated circuit 136. For illustrative purposes, the first top integrated circuit 136 is shown as a wirebond integrated circuit, although it is understood that the first top integrated circuit 136 can be any other semiconductor device.

The top package 128 can include a first top connector 140, which is an electrical connector. The first top connector 140 can electrically connect the second top substrate side 134 and the first top integrated circuit 136. For illustrative purposes, the first top connector 140 is shown as a bond wire, although it is understood that the first top connector 140 can be any other electrical connector.

The top package 128 can include a second top integrated circuit 142, which is a semiconductor device. The second top integrated circuit 142 can be mounted over the first top integrated circuit 136. The top package 128 can include a second top attach layer 144, which attaches the first top integrated circuit 136 and the second top integrated circuit 142. For illustrative purposes, the second top integrated circuit 142 is shown as a wirebond integrated circuit, although it is understood that the second top integrated circuit 142 can be any other semiconductor device.

The top package 128 can include a second top connector 146, which is an electrical connector. The second top connector 146 can electrically connect the second top substrate side 134 and the second top integrated circuit 142. For illustrative purposes, the second top connector 146 is shown as a bond wire, although it is understood that the second top connector 146 can be any other electrical connector.

The top package 128 can include a top encapsulation 148, which covers a semiconductor package to seal electrical devices providing mechanical and environmental protection. The top encapsulation 148 can be a package cover including an encapsulant or a mold material.

The top encapsulation 148 can be formed over the second top substrate side 134. The top encapsulation 148 can cover the first top integrated circuit 136, the first top attach layer 138, the first top connector 140, the second top integrated circuit 142, the second top attach layer 144, and the second top connector 146.

The top package 128 can include a top interconnect 150, which is an electrical connector that provides electrical connectivity between the bottom substrate 104 and the top substrate 130. The top interconnect 150 can be outside a perimeter of the bottom integrated circuit 110. The top interconnect 150 can be attached to the first top substrate side 132.

The top interconnect 150 can be formed with a conductive material including solder or a metallic alloy. For example, the top interconnect 150 can be a conductive connector including an inner solder joint, a critical solder joint, or a solder ball. For illustrative purposes, the top interconnect 150 is shown as a conductive ball, although it is understood that the top interconnect 150 can be any other electrical connector.

The top package 128 can be mounted over the bottom package 102. The first top substrate side 132 can be over the second bottom substrate side 108 and the bottom integrated circuit 110. The top substrate 130 can be over a side of the bottom integrated circuit 110 opposite the bottom substrate 104.

The thermal interface layer 116 can be between the bottom integrated circuit 110 and the top substrate 130. The thermal interface layer 116 can be thermally connected to the bottom integrated circuit 110 and the first top substrate side 132.

The top interconnect 150 can electrically connect the second bottom substrate side 108 and the first top substrate side 132. The top interconnect 150 can be in a gap between the second bottom substrate side 108 and the first top substrate side 132. For example, the gap can be spacing including a package-on-package (PoP) standoff gap or an inter-package space.

The integrated circuit packaging system 100 can include a structure of a pre-stacked package-on-package (PoP) with an underfill layer 152, which covers the top interconnect 150 for providing reinforcement purposes. The underfill layer 152 can be pre-applied to reinforce the top interconnect 150 within the inter-package space.

The underfill layer 152 can encapsulate the top interconnect 150 with the bottom integrated circuit 110 wholly exposed from the underfill layer 152. The underfill layer 152 can be outside a perimeter of the bottom integrated circuit 110.

The underfill layer 152 can improve mechanical and thermal performances based on thermal cycling and mechanical drop impact tests. The underfill layer 152 can be formed with a reinforcement material including a reinforced gap filling material, a reinforced underfill (UF) film, or a pre-applied B-stage photoimageable underfill (UF) film. The underfill layer 152 can be formed with a material that provides a spacing between the bottom substrate 104 and the top substrate 130.

The underfill layer 152 can encapsulate and reinforce the top interconnect 150 within the gap between the second bottom substrate side 108 and the first top substrate side 132. The underfill layer 152 can be directly on portions of the second bottom substrate side 108 and the first top substrate side 132.

The underfill layer 152 can surround the top interconnect 150, leaving the bottom integrated circuit 110, the bottom connector 114, and the thermal interface layer 116 exposed. The underfill layer 152 can be formed adjacent the bottom integrated circuit 110.

The integrated circuit packaging system 100 can be applicable to a pre-stacked package-on-package (PoP) structure, having the top package 128 mounted over the bottom package 102 before the integrated circuit packaging system 100 is connected to the external systems (not shown). The integrated circuit packaging system 100 can provide an under-filling method for encapsulating the top interconnect 150 within the package-on-package (PoP) structure.

Better warpage control can be achieved with the underfill layer 152 pre-defined for the pre-stacked package-on-package (PoP) prior to board level mounting. For example, the underfill layer 152 can assist controlling warpage.

The underfill layer 152 can be pre-applied directly on either the second bottom substrate side 108 or the first top substrate side 132 by a lamination or printing method. The term pre-applied means that the underfill layer 152 is applied before the top package 128 is mounted over the bottom package 102.

For example, a proposed under-filling method involves various form factors, which can be ascending, descending, or straight profile in structure. Also for example, an underfill (UF) flow for the present invention is from an upper package down to a lower package through some structural means. Further, for example, an underfill (UF) application from the proposed under-filling method will be better in rheological control and consistent void free coverage performance.

The underfill layer 152 does not conform to all spaces or cavities formed between the bottom substrate 104 and the top substrate 130. The underfill layer 152 is preferably confined to a region surrounding the top interconnect 150 and can cover portions of the second bottom substrate side 108 and the first top substrate side 132. Some epoxy mold compounds might not be suitable as they conform to all spaces or cavities and would not be confined to a region.

The bottom integrated circuit 110 can be optionally encapsulated with an encapsulation material including an underfill, an underfill-mold compound, or a molded underfill. The bottom integrated circuit 110, the top interconnect 150, or a combination thereof can be embedded in or encapsulated with the encapsulation material.

It has been discovered that the present invention provides the underfill layer 152 to reinforce the top interconnect 150 within the inter-package space, thereby enhancing mechanical integrity (e.g. temperature cycling test reliability, mechanical shock/impact resistance performance, or better warpage control). It has been unexpectedly found that better warpage control is achieved with the underfill layer 152 surrounding the top interconnect 150 prior to board level mounting.

It has been unexpectedly observed that the present invention having the underfill layer 152 surrounding the top interconnect 150 facilitates a board level mounting process and allows a surface mount technology (SMT) manufacturer undergoing an underfill process only to the bottom interconnect 126 of the bottom package 102 upon mounting the pre-stacked package-on-package (PoP) on a printed circuit board. Therefore, a complicated underfill process for multi-level standoff gaps can be avoided. Since the underfill layer 152 is already pre-defined between the bottom package 102 and the top package 128, a capillary type underfill material can be readily applied to the bottom package 102.

It has also been discovered that the underfill layer 152 surrounding the top interconnect 150 resulting in less material consumption or wastage. It has been unexpectedly found that no underfill overspread (or tongue) is formed around a periphery of the pre-stacked package-on-package (PoP), eliminating a need of a large keep out zone for board-level designs to accommodate the underfill overspread.

It has further been discovered that the present invention provides thermal enhancement with the thermal interface layer 116 pre-applied directly on the bottom integrated circuit 110 and between the bottom package 102 and the top package 128. It has been unexpectedly found that the present invention further enhances thermal dissipation capability with the underfill layer 152 within the structure of the pre-stacked package-on-package (PoP) and thermally conductive for conducting heat away from the bottom substrate 104 and the top substrate 130.

Referring now to FIG. 2, therein is shown a top plan view of the integrated circuit packaging system 100. The top plan view is shown without the first top integrated circuit 136 of FIG. 1, the first top attach layer 138 of FIG. 1, and the first top connector 140 of FIG. 1. Also, the top plan view is shown without the second top integrated circuit 142 of FIG. 1, the second top attach layer 144 of FIG. 1, the second top connector 146 of FIG. 1, and the top encapsulation 148 of FIG. 1.

The integrated circuit packaging system 100 can include the top substrate 130 having a periphery 202. The top interconnect 150 can be formed in a peripheral array adjacent the periphery 202.

For illustrative purposes, the top interconnect 150 is shown in two rows along each side of the top substrate 130, although it is understood that the top interconnect 150 can be formed in different configurations. Also for illustrative purposes, the top interconnect 150 is shown having a circular shape, although it is understood that the top interconnect 150 can have different shapes.

The underfill layer 152 can be formed to surround the top interconnect 150. The underfill layer 152 can be formed only between the periphery 202 and the bottom integrated circuit 110, shown as a dash rectangle.

The underfill layer 152 can have an inner boundary 204 and an outer boundary 206 opposite to the inner boundary 204. The inner boundary 204 and the outer boundary 206 define extents of the underfill layer 152. For illustrative purposes, the inner boundary 204 and the outer boundary 206 are shown with each having a rectangular shape, although it is understood that the inner boundary 204 and the outer boundary 206 can have different shapes.

The inner boundary 204 can be adjacent and around the bottom integrated circuit 110. The inner boundary 204 can be between the bottom integrated circuit 110 and the top interconnect 150. The outer boundary 206 can be adjacent and along the periphery 202. The outer boundary 206 can be between the top interconnect 150 and the periphery 202. The inner boundary 204 can be further from the periphery 202 than the outer boundary 206.

The underfill layer 152 can include a contiguous shape of a ring surrounding the bottom integrated circuit 110. The ring is bounded by the inner boundary 204 and the outer boundary 206. For example, the underfill layer 152 can include a continuous structure enclosing and having a spacing from the bottom integrated circuit 110. Also for example, the underfill layer 152 can include a structure having a rectangular shape and a hole with the bottom integrated circuit 110 within the hole.

In an alternative embodiment, the underfill layer 152 can be formed in a discontinuous manner. The underfill layer 152 can include a non-contiguous structure, which includes a number of discontinuous sections. The underfill layer 152 can be formed adjacent sides 208 of the top substrate 130. The sides 208 define the periphery 202 of the top substrate 130.

For example, the underfill layer 152 can include a number of discontinuous sections depending on the location of the top interconnect 150. Also for example, the underfill layer 152 can cover a number of the top interconnect 150 located or connected only at two of the sides 208 that are opposite to each other.

Figure 3:
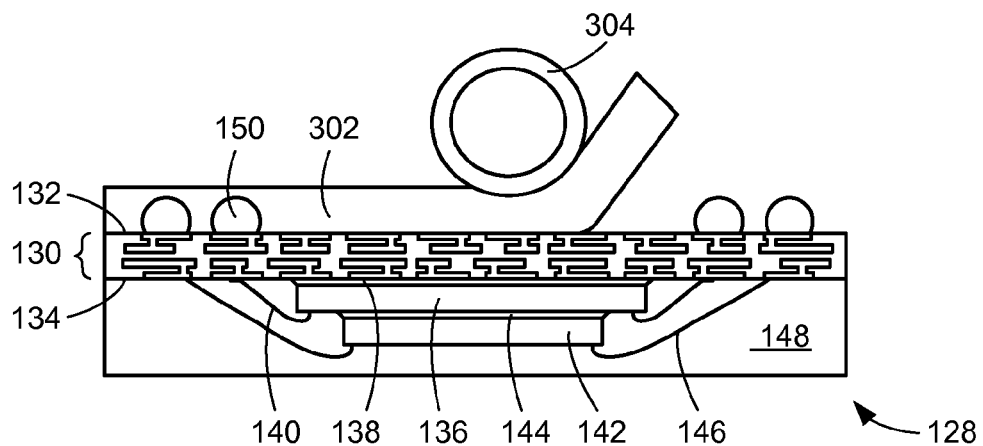
FIG. 3 is a cross-sectional view of a portion of the integrated circuit packaging system of FIG. 1 in an applying phase of a first manufacturing process.

Referring now to FIG. 3, therein is shown a cross-sectional view of a portion of the integrated circuit packaging system 100 of FIG. 1 in an applying phase of a first manufacturing process. The top package 128 can include the top substrate 130 having the first top substrate side 132 and the second top substrate side 134.

The top package 128 can include the first top integrated circuit 136 attached to the second top substrate side 134 with the first top attach layer 138. The first top integrated circuit 136 can be connected to the second top substrate side 134 with the first top connector 140. The second top integrated circuit 142 can be attached to the first top integrated circuit 136 with the second top attach layer 144. The second top integrated circuit 142 can be connected to the second top substrate side 134 with the second top connector 146.

The top package 128 can include the top encapsulation 148 over the second top substrate side 134. The top encapsulation 148 can cover the first top integrated circuit 136, the first top attach layer 138, the first top connector 140, the second top integrated circuit 142, the second top attach layer 144, and the second top connector 146.

The top package 128 can include the top interconnect 150 attached to the first top substrate side 132. The top package 128 can be inverted such that the first top substrate side 132 faces upward and is over the second top substrate side 134.

With the top package 128 inverted, an underfill material 302, which is a reinforcement material including an underfill compound or a photosensitive material, can be pre-applied over the first top substrate side 132. The term pre-applied means that the underfill material 302 is applied before the top package 128 is mounted over the bottom package 102 of FIG. 1 in a subsequent phase of the first manufacturing process.

The underfill material 302 can be provided in a film or a sheet. The underfill material 302 can cover the top interconnect 150 and the first top substrate side 132. The underfill material 302 can be applied by a lamination process. The lamination process can include thermal conditioning or bonding. For example, the thermal conditioning can include heating the underfill material 302 to a lamination temperature.

The lamination process can include any pressing mechanism including a roller 304, which is a device that is used to apply the underfill material 302. The roller 304 can be placed on the underfill material 302 to press the underfill material 302 on the first top substrate side 132.

Figure 4:
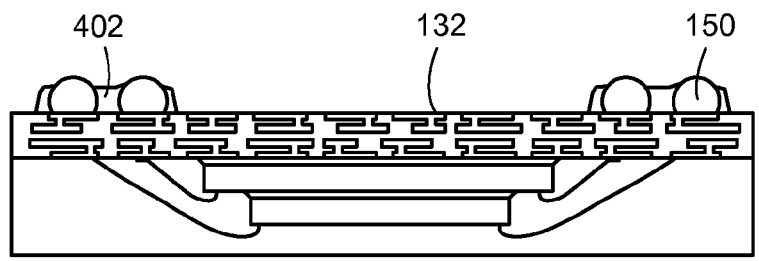
FIG. 4 is the structure of FIG. 3 in a patterning phase.

Referring now to FIG. 4, therein is shown the structure of FIG. 3 in a patterning phase. After the applying phase, a top portion of the top interconnect 150 can protrude with aid of a thermal lamination used in the applying phase. The top portion protruded means that the top portion is exposed from or not covered by the underfill material 302 of FIG. 3. With the top portion protruded, the top interconnect 150 can make good contact with a connection pad of the bottom substrate 104 of FIG. 1 in a subsequent phase of the first manufacturing process.

The underfill material 302 can be selectively patterned. A patterned underfill 402 can be formed by partially removing the underfill material 302. The patterned underfill 402 is a portion of the underfill material 302 that remains after the removal.

The patterned underfill 402 can be formed to protect the top interconnect 150 for reinforcement purposes. The patterned underfill 402 can be at a selected region of the first top substrate side 132. The selected region is a portion of the first top substrate side 132 to where the top interconnect 150 is connected.

Figure 5:
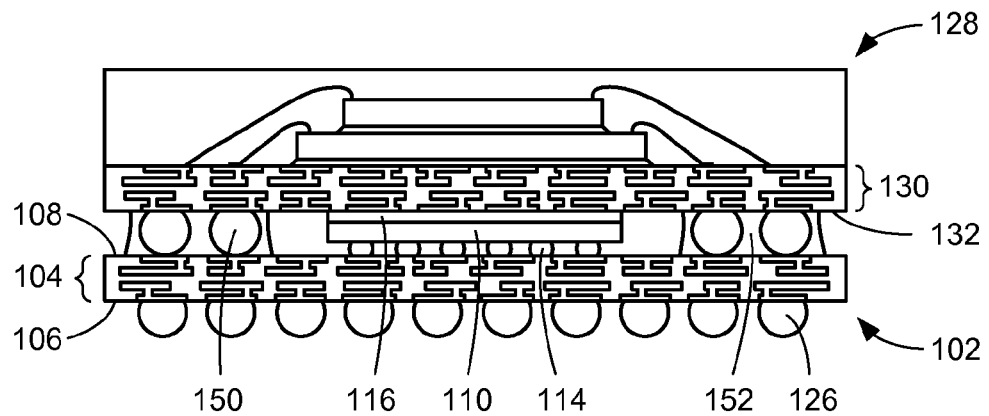
FIG. 5 is the structure of FIG. 4 in a curing phase.

Referring now to FIG. 5, therein is shown the structure of FIG. 4 in a curing phase. The bottom package 102 can include the bottom substrate 104 having the first bottom substrate side 106 and the second bottom substrate side 108. The bottom integrated circuit 110 can be connected to the second bottom substrate side 108 with the bottom connector 114.

The bottom package 102 can optionally include the thermal interface layer 116 deposited directly on the bottom integrated circuit 110. The thermal interface layer 116 can be deposited before the bottom integrated circuit 110 is mounted over the second bottom substrate side 108, the top package 128 is mounted over the bottom package 102, or a combination thereof. The bottom package 102 can include the bottom interconnect 126 attached to the first bottom substrate side 106.

The top package 128 can be mounted over the bottom package 102 with a pick and place process. The top substrate 130 can be over the thermal interface layer 116. The thermal interface layer 116 can be thermally connected to the bottom integrated circuit 110 and the first top substrate side 132.

The top interconnect 150 can be electrically connected to the second bottom substrate side 108 and the first top substrate side 132. The top interconnect 150 can make good contact with the connection pad of the bottom substrate 104. The connection pad can be at the second bottom substrate side 108.

A reflow process can be used to bond the top interconnect 150 and the connection pad of the bottom substrate 104. A curing process can be used to harden the patterned underfill 402 of FIG. 4 to form the underfill layer 152. The underfill layer 152 can protect the top interconnect 150 within the gap between the second bottom substrate side 108 and the first top substrate side 132.

The underfill layer 152 can be directly on portions of the second bottom substrate side 108 and the first top substrate side 132. The underfill layer 152 can cover the top interconnect 150 leaving the bottom integrated circuit 110, the bottom connector 114, and the thermal interface layer 116 exposed.

Figure 6:
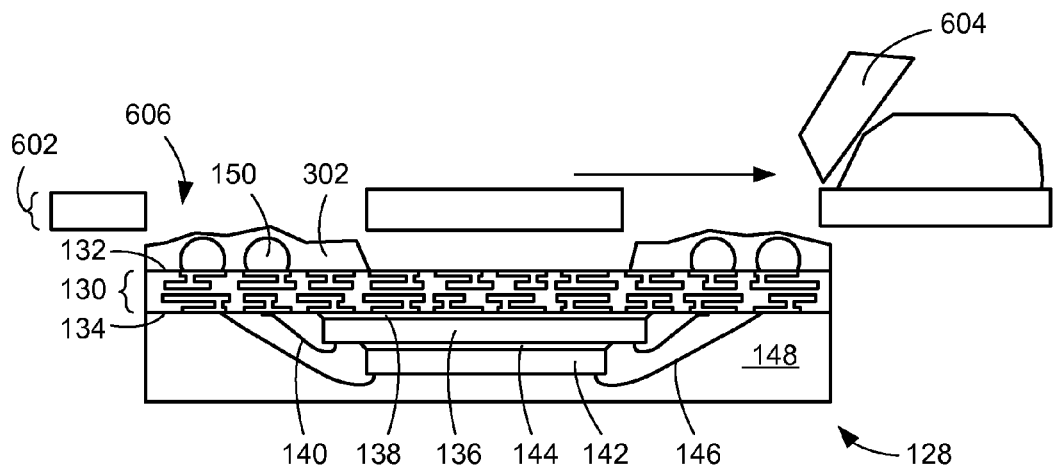
FIG. 6 is a cross-sectional view of a portion of the integrated circuit packaging system of FIG. 1 in an applying phase of a second manufacturing process.

Referring now to FIG. 6, therein is shown a cross-sectional view of a portion of the integrated circuit packaging system 100 of FIG. 1 in an applying phase of a second manufacturing process. The top package 128 can include the top substrate 130 having the first top substrate side 132 and the second top substrate side 134.

The top package 128 can include the first top integrated circuit 136 attached to the second top substrate side 134 with the first top attach layer 138. The first top integrated circuit 136 can be connected to the second top substrate side 134 with the first top connector 140. The second top integrated circuit 142 can be attached to the first top integrated circuit 136 with the second top attach layer 144. The second top integrated circuit 142 can be connected to the second top substrate side 134 with the second top connector 146.

The top package 128 can include the top encapsulation 148 over the second top substrate side 134. The top encapsulation 148 can cover the first top integrated circuit 136, the first top attach layer 138, the first top connector 140, the second top integrated circuit 142, the second top attach layer 144, and the second top connector 146.

The top package 128 can include the top interconnect 150 attached to the first top substrate side 132. The top package 128 can be inverted such that the first top substrate side 132 faces upward and is over the second top substrate side 134.

With the top package 128 inverted, the underfill material 302 can be pre-applied on the first top substrate side 132. The term pre-applied means that the underfill material 302 is applied before the top package 128 is mounted over the bottom package 102 of FIG. 1 in a subsequent phase of the second manufacturing process.

The underfill material 302 can be applied by a printing process with a stencil 602 and a squeegee 604. The stencil 602 is a device that is perforated for printing purposes. The stencil 602 can include an aperture 606, which is a perforation through which the underfill material 302 can pass. The squeegee 604 is a device that is used to spread the underfill material 302 on the stencil 602 in a printing direction as shown by an arrow.

The stencil 602 can be positioned over the top substrate 130 such that the aperture 606 is aligned with a portion of the first top substrate side 132 to where the top interconnect 150 is connected. The squeegee 604 can spread the underfill material 302 on the stencil 602.

A portion of the underfill material 302 can pass through the aperture 606 down to the first top substrate side 132. The portion of the underfill material 302 can be deposited on the first top substrate side 132 to cover the top interconnect 150. The portion of the underfill material 302 can conform to a shape of the aperture 606.

Figure 7:
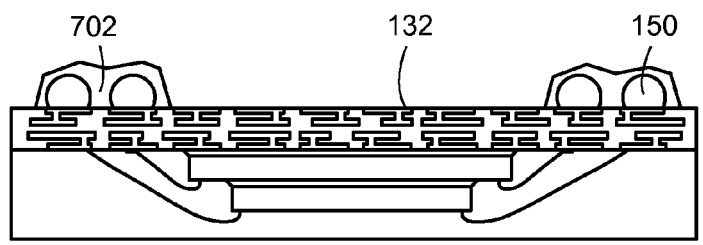
FIG. 7 is the structure of FIG. 6 in a patterning phase.

Referring now to FIG. 7, therein is shown the structure of FIG. 6 in a patterning phase. The underfill material 302 of FIG. 3 as formed in FIG. 6 can be selectively patterned. A patterned underfill 702 can be formed by partially removing the underfill material 302. The patterned underfill 702 is a portion of the underfill material 302 that remains after the removal.

The patterned underfill 702 can be formed to protect the top interconnect 150 for reinforcement purposes. The patterned underfill 702 can be at a selected region of the first top substrate side 132. The selected region is a portion of the first top substrate side 132 to where the top interconnect 150 is connected.

Figure 8:
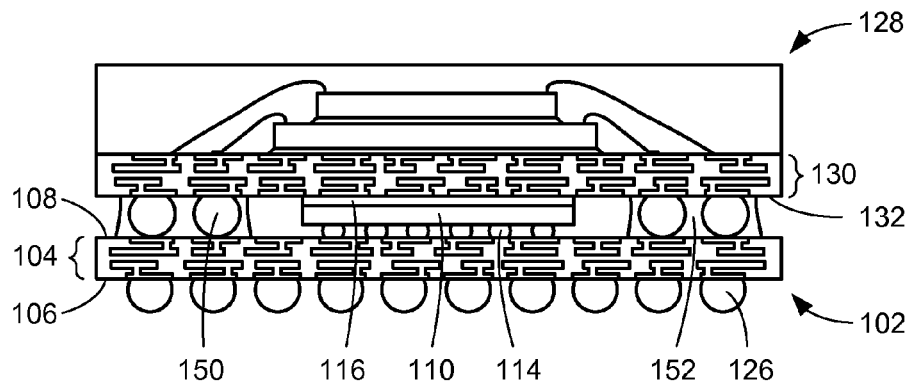
FIG. 8 is the structure of FIG. 7 in a curing phase.

Referring now to FIG. 8, therein is shown the structure of FIG. 7 in a curing phase. The bottom package 102 can include the bottom substrate 104 having the first bottom substrate side 106 and the second bottom substrate side 108. The bottom integrated circuit 110 can be connected to the second bottom substrate side 108 with the bottom connector 114.

The bottom package 102 can optionally include the thermal interface layer 116 deposited directly on the bottom integrated circuit 110. The thermal interface layer 116 can be deposited before the bottom integrated circuit 110 is mounted over the second bottom substrate side 108, the top package 128 is mounted over the bottom package 102, or a combination thereof. The bottom package 102 can include the bottom interconnect 126 attached to the first bottom substrate side 106.

The top package 128 can be mounted over the bottom package 102 with a pick and place process. A thermal aided bonding method can be used to form a reliable mechanical and electrical connection between the second bottom substrate side 108 and the top interconnect 150.

The top substrate 130 can be over the thermal interface layer 116. The thermal interface layer 116 can be thermally connected to the bottom integrated circuit 110 and the first top substrate side 132.

The top interconnect 150 can be electrically connected to the second bottom substrate side 108 and the first top substrate side 132. The top interconnect 150 can make good contact with the connection pad of the bottom substrate 104. The connection pad can be at the second bottom substrate side 108.

A reflow process can be used to bond the top interconnect 150 and the connection pad of the bottom substrate 104. A curing process can be used to harden the patterned underfill 702 of FIG. 7 to form the underfill layer 152. The underfill layer 152 can protect the top interconnect 150 within the gap between the second bottom substrate side 108 and the first top substrate side 132.

The underfill layer 152 can be directly on portions of the second bottom substrate side 108 and the first top substrate side 132. The underfill layer 152 can cover the top interconnect 150 leaving the bottom integrated circuit 110, the bottom connector 114, and the thermal interface layer 116 exposed.

Figure 9:
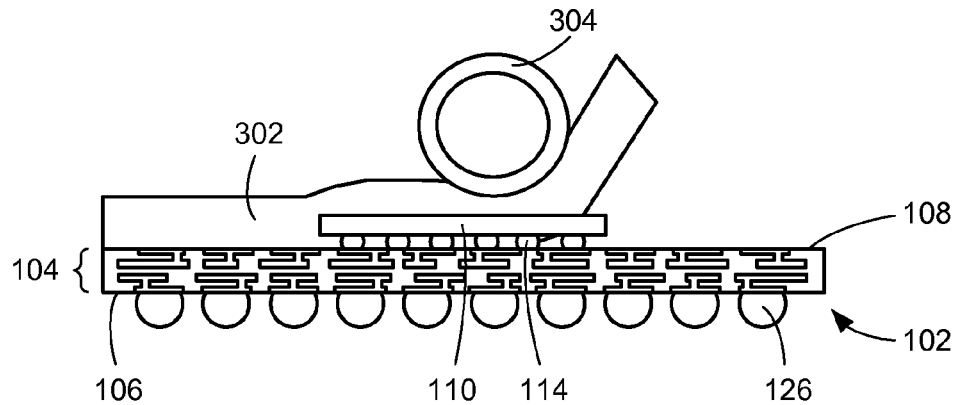
FIG. 9 is a cross-sectional view of a portion of the integrated circuit packaging system of FIG. 1 in an applying phase of a third manufacturing process.

Referring now to FIG. 9, therein is shown a cross-sectional view of a portion of the integrated circuit packaging system 100 of FIG. 1 in an applying phase of a third manufacturing process. The bottom package 102 can include the bottom substrate 104 having the first bottom substrate side 106 and the second bottom substrate side 108. The bottom integrated circuit 110 can be connected to the second bottom substrate side 108 with the bottom connector 114. The bottom interconnect 126 can be attached to the first bottom substrate side 106.

The underfill material 302 can be pre-applied over the second bottom substrate side 108. The term pre-applied means that the underfill material 302 is applied before the top package 128 of FIG. 1 is mounted over the bottom package 102 in a subsequent phase of the third manufacturing process.

The underfill material 302 can be provided in a film or a sheet. The underfill material 302 can cover the second bottom substrate side 108, the bottom integrated circuit 110, and the bottom connector 114. The underfill material 302 can be applied by a lamination process.

The lamination process can include any pressing mechanism including the roller 304. The roller 304 can be placed on the underfill material 302 to press the underfill material 302 on the second bottom substrate side 108.

Figure 10:
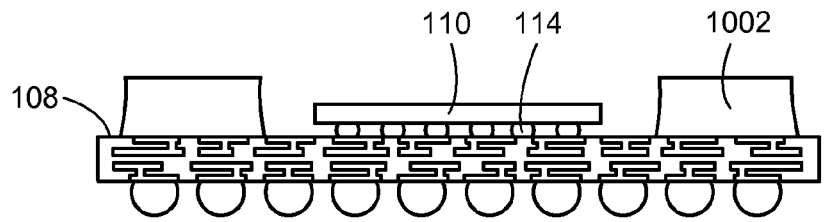
FIG. 10 is the structure of FIG. 9 in a patterning phase.

Referring now to FIG. 10, therein is shown the structure of FIG. 9 in a patterning phase. The underfill material 302 of FIG. 3 as formed in FIG. 9 can be selectively patterned. A patterned underfill 1002 can be formed by partially removing a portion of the underfill material 302 that covers the bottom integrated circuit 110 and the bottom connector 114. The patterned underfill 1002 is another portion of the underfill material 302 that remains after the removal.

The patterned underfill 1002 can be formed to protect the top interconnect 150 of FIG. 1 for reinforcement purposes in a subsequent phase of the third manufacturing process. The patterned underfill 1002 can be at a selected region of the second bottom substrate side 108. The selected region is a portion of the second bottom substrate side 108 to where the top interconnect 150 is to be connected.

With the underfill material 302 of FIG. 9 applied on the second bottom substrate side 108, the patterned underfill 1002 can be formed by applying a mask (not shown) directly on the underfill material 302 to expose a portion of the underfill material 302 to a light or radiation source. The patterned underfill 1002 can be harden and insolvable to a solvent. Another portion of the underfill material 302 that is unexposed to the light source can be solvable to the solvent and removed including washed away by the solvent.

Figure 11:
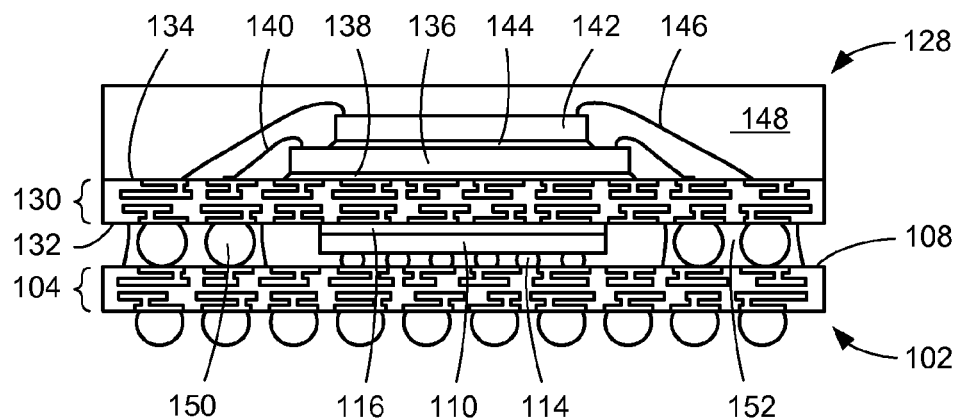
FIG. 11 is the structure of FIG. 10 in a curing phase.

Referring now to FIG. 11, therein is shown the structure of FIG. 10 in a curing phase. After the patterning phase, the thermal interface layer 116 can optionally be deposited directly on the bottom integrated circuit 110.

The top package 128 can include the top substrate 130 having the first top substrate side 132 and the second top substrate side 134. The top package 128 can include the first top integrated circuit 136 attached to the second top substrate side 134 with the first top attach layer 138. The first top integrated circuit 136 can be connected to the second top substrate side 134 with the first top connector 140. The second top integrated circuit 142 can be attached to the first top integrated circuit 136 with the second top attach layer 144. The second top integrated circuit 142 can be connected to the second top substrate side 134 with the second top connector 146.

The top package 128 can include the top encapsulation 148 over the second top substrate side 134. The top encapsulation 148 can cover the first top integrated circuit 136, the first top attach layer 138, the first top connector 140, the second top integrated circuit 142, the second top attach layer 144, and the second top connector 146. The top package 128 can include the top interconnect 150 attached to the first top substrate side 132.

The top package 128 can be mounted over the bottom package 102 with a pick and place process. The top package 128 can be placed with the top interconnect 150 through the patterned underfill 1002 of FIG. 10 such that the top interconnect 150 is on the second bottom substrate side 108. A thermal aided bonding method can be used to form a reliable mechanical and electrical connection between the second bottom substrate side 108 and the top interconnect 150.

The top substrate 130 can be over the thermal interface layer 116. The thermal interface layer 116 can be thermally connected to the bottom integrated circuit 110 and the first top substrate side 132.

The top interconnect 150 can be electrically connected to the second bottom substrate side 108 and the first top substrate side 132. The top interconnect 150 can make good contact with the connection pad of the bottom substrate 104. The connection pad can be at the second bottom substrate side 108.

A reflow process can be used to bond the top interconnect 150 and the connection pad of the bottom substrate 104. A curing process can be used to harden the patterned underfill 1002 to form the underfill layer 152. The underfill layer 152 can protect the top interconnect 150 within the gap between the second bottom substrate side 108 and the first top substrate side 132.

The underfill layer 152 can be directly on portions of the second bottom substrate side 108 and the first top substrate side 132. The underfill layer 152 can cover the top interconnect 150 leaving the bottom integrated circuit 110, the bottom connector 114, and the thermal interface layer 116 exposed.

Figure 12:
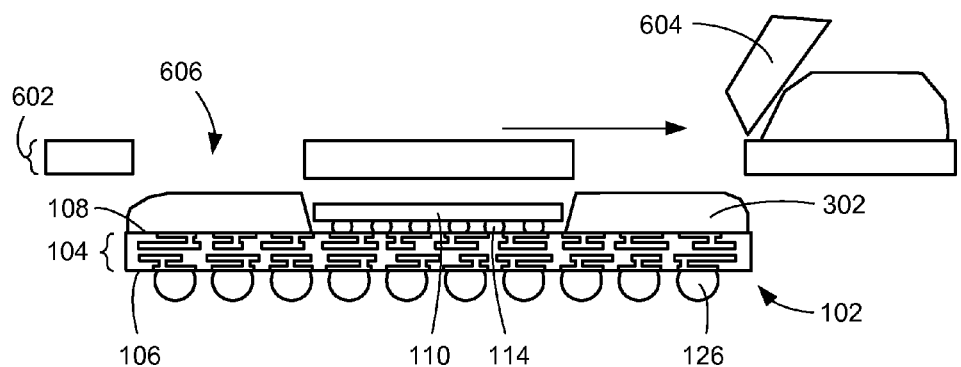
FIG. 12 is a cross-sectional view of a portion of the integrated circuit packaging system of FIG. 1 in an applying phase of a fourth manufacturing process.

Referring now to FIG. 12, therein is shown a cross-sectional view of a portion of the integrated circuit packaging system 100 of FIG. 1 in an applying phase of a fourth manufacturing process. The bottom package 102 can include the bottom substrate 104 having the first bottom substrate side 106 and the second bottom substrate side 108.

The bottom integrated circuit 110 can be connected to the second bottom substrate side 108 with the bottom connector 114. The bottom interconnect 126 can be attached to the first bottom substrate side 106.

The underfill material 302 can be pre-applied on the second bottom substrate side 108. The term pre-applied means that the underfill material 302 is applied before the top package 128 of FIG. 1 is mounted over the bottom package 102 in a subsequent phase of the fourth manufacturing process.

The underfill material 302 can be applied by a printing process with the stencil 602 and the squeegee 604. The stencil 602 can include the aperture 606. The squeegee 604 can be used to spread the underfill material 302 on the stencil 602 in a printing direction as shown by an arrow.

The stencil 602 can be positioned over the bottom substrate 104 such that the aperture 606 is aligned with a portion of the second bottom substrate side 108 to where the top interconnect 150 of FIG. 1 is to be connected in a subsequent phase of the fourth manufacturing process. The squeegee 604 can spread the underfill material 302 on the stencil 602.

A portion of the underfill material 302 can pass through the aperture 606 down to the second bottom substrate side 108. The portion of the underfill material 302 can be deposited on the second bottom substrate side 108. The portion of the underfill material 302 can conform to a shape of the aperture 606.

Figure 13:
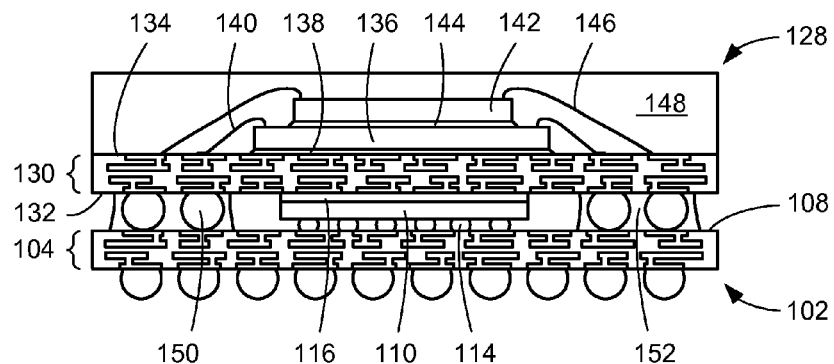
FIG. 13 is the structure of FIG. 12 in a curing phase.

Referring now to FIG. 13, therein is shown the structure of FIG. 12 in a curing phase. After the applying phase, the thermal interface layer 116 can optionally be deposited directly on the bottom integrated circuit 110.

The top package 128 can include the top substrate 130 having the first top substrate side 132 and the second top substrate side 134. The top package 128 can include the first top integrated circuit 136 attached to the second top substrate side 134 with the first top attach layer 138. The first top integrated circuit 136 can be connected to the second top substrate side 134 with the first top connector 140. The second top integrated circuit 142 can be attached to the first top integrated circuit 136 with the second top attach layer 144. The second top integrated circuit 142 can be connected to the second top substrate side 134 with the second top connector 146.

The top package 128 can include the top encapsulation 148 over the second top substrate side 134. The top encapsulation 148 can cover the first top integrated circuit 136, the first top attach layer 138, the first top connector 140, the second top integrated circuit 142, the second top attach layer 144, and the second top connector 146. The top package 128 can include the top interconnect 150 attached to the first top substrate side 132.

The top package 128 can be mounted over the bottom package 102 with a pick and place process. The top package 128 can be placed with the top interconnect 150 through the underfill material 302 of FIG. 3 such that the top interconnect 150 is on the second bottom substrate side 108. A thermal aided bonding method can be used to form a reliable mechanical and electrical connection between the second bottom substrate side 108 and the top interconnect 150.

The top substrate 130 can be over the thermal interface layer 116. The thermal interface layer 116 can be thermally connected to the bottom integrated circuit 110 and the first top substrate side 132.

The top interconnect 150 can be electrically connected to the second bottom substrate side 108 and the first top substrate side 132. The top interconnect 150 can make good contact with the connection pad of the bottom substrate 104. The connection pad can be at the second bottom substrate side 108.

A reflow process can be used to bond the top interconnect 150 and the connection pad of the bottom substrate 104. With the underfill material 302 formed as previously described in FIG. 12, a curing process can be used to harden the underfill material 302 to form the underfill layer 152. The underfill layer 152 can protect the top interconnect 150 within the gap between the second bottom substrate side 108 and the first top substrate side 132.

The underfill layer 152 can be directly on portions of the second bottom substrate side 108 and the first top substrate side 132. The underfill layer 152 can cover the top interconnect 150 leaving the bottom integrated circuit 110, the bottom connector 114, and the thermal interface layer 116 exposed.

Figure 14:
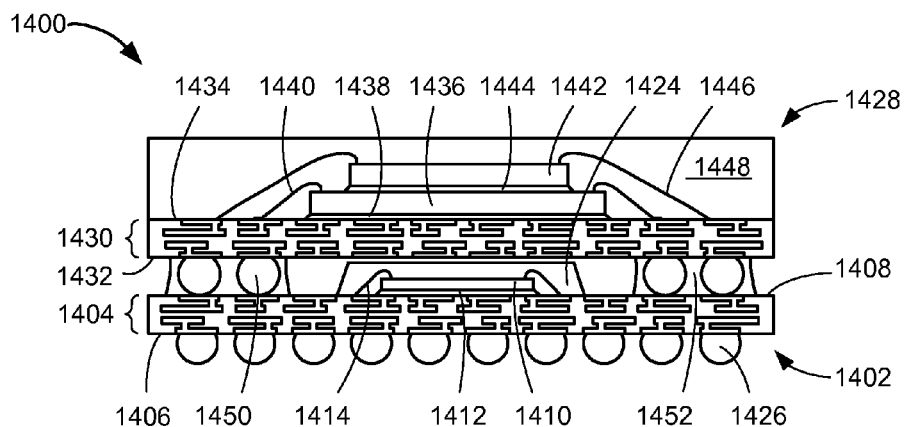
FIG. 14 is a cross-sectional view similar to FIG. 1 of an integrated circuit packaging system in a second embodiment of the present invention.

Referring now to FIG. 14, therein is shown a cross-sectional view similar to FIG. 1 of an integrated circuit packaging system 1400 in a second embodiment of the present invention. The integrated circuit packaging system 1400 can include a bottom package 1402.

The bottom package 1402 can be formed in a manner similar to the bottom package 102 of FIG. 1, except for the formation of the bottom integrated circuit 110 of FIG. 1 and the bottom connector 114 of FIG. 1. The bottom package 1402 can additionally include an attachment layer and a package cover.

The bottom package 1402 can include a bottom substrate 1404 having a first bottom substrate side 1406 and a second bottom substrate side 1408. The bottom substrate 1404 can be formed in a manner similar to the bottom substrate 104 of FIG. 1.

The bottom package 1402 can include a bottom integrated circuit 1410, which is a semiconductor device. For illustrative purposes, the bottom integrated circuit 1410 is shown as a wirebond device, although it is understood that the bottom integrated circuit 1410 can be any other semiconductor device.

The bottom integrated circuit 1410 can be mounted over the second bottom substrate side 1408. The bottom package 1402 can include a bottom attach layer 1412, which attaches the second bottom substrate side 1408 and the bottom integrated circuit 1410.

The bottom package 1402 can include a bottom connector 1414, which is an electrical connector. The bottom connector 1414 can electrically connect the second bottom substrate side 1408 and the bottom integrated circuit 1410. For illustrative purposes, the bottom connector 1414 is shown as a bond wire, although it is understood that the bottom connector 1414 can be any other electrical connector.

The bottom package 1402 can include a bottom encapsulation 1424, which covers a semiconductor package to seal electrical devices providing mechanical and environmental protection. The bottom encapsulation 1424 can be a package cover including an encapsulant or a mold material.

The bottom encapsulation 1424 can be formed over the second bottom substrate side 1408. The bottom encapsulation 1424 can cover the bottom integrated circuit 1410, the bottom attach layer 1412, and the bottom connector 1414.

The bottom package 1402 can include a bottom interconnect 1426. The bottom interconnect 1426 can be formed in a manner similar to the bottom interconnect 126 of FIG. 1.

The integrated circuit packaging system 1400 can include a top package 1428. The top package 1428 can be formed in a manner similar to the top package 128 of FIG. 1. The top package 1428 can include a top substrate 1430 having a first top substrate side 1432 and a second top substrate side 1434.

The top package 1428 can include a first top integrated circuit 1436, a first top attach layer 1438, and a first top connector 1440. The top package 1428 can also include a second top integrated circuit 1442, a second top attach layer 1444, and a second top connector 1446. The top package 1428 can further include a top encapsulation 1448 and a top interconnect 1450.

The top package 1428 can be mounted over the bottom package 1402 in a manner similar to the top package 128, except that the first top substrate side 1432 can be over the bottom encapsulation 1424. The integrated circuit packaging system 1400 can include an underfill layer 1452. The underfill layer 1452 can be formed in a manner similar to the underfill layer 152 of FIG. 1, except that the underfill layer 1452 can be adjacent the bottom encapsulation 1424.

It has been discovered that the present invention provides the underfill layer 1452 to reinforce the top interconnect 1450 in a structure having the bottom package 1402, such as a package-on-package bottom (PoPb) package, with the bottom integrated circuit 1410 as a wirebond (WB) device.

Figure 15:
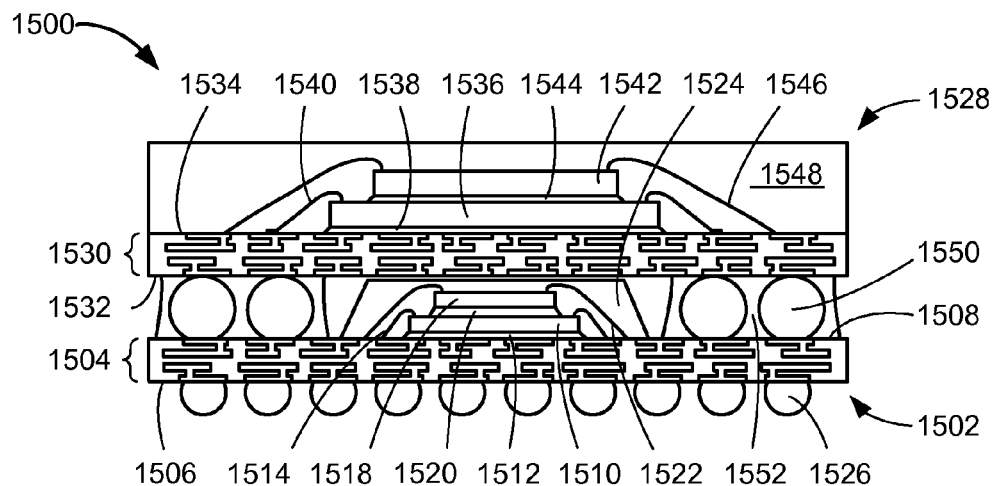
FIG. 15 is a cross-sectional view similar to FIG. 1 of an integrated circuit packaging system in a third embodiment of the present invention.

Referring now to FIG. 15, therein is shown a cross-sectional view similar to FIG. 1 of an integrated circuit packaging system 1500 in a third embodiment of the present invention. The integrated circuit packaging system 1500 can include a bottom package 1502.

The bottom package 1502 can be formed in a manner similar to the bottom package 102 of FIG. 1, except for the formation of the bottom integrated circuit 110 of FIG. 1 and the bottom connector 114 of FIG. 1. The bottom package 1502 can additionally include attachment layers, another integrated circuit, another connector, and a package cover.

The bottom package 1502 can include a bottom substrate 1504 having a first bottom substrate side 1506 and a second bottom substrate side 1508. The bottom substrate 1504 can be formed in a manner similar to the bottom substrate 104 of FIG. 1.

The bottom package 1502 can include a first bottom integrated circuit 1510, which is a semiconductor device. For illustrative purposes, the first bottom integrated circuit 1510 is shown as a wirebond device, although it is understood that the first bottom integrated circuit 1510 can be any other semiconductor device.

The first bottom integrated circuit 1510 can be mounted over the second bottom substrate side 1508. The bottom package 1502 can include a first bottom attach layer 1512, which attaches the second bottom substrate side 1508 and the first bottom integrated circuit 1510.

The bottom package 1502 can include a first bottom connector 1514, which is an electrical connector. The first bottom connector 1514 can electrically connect the second bottom substrate side 1508 and the first bottom integrated circuit 1510. For illustrative purposes, the first bottom connector 1514 is shown as a bond wire, although it is understood that the first bottom connector 1514 can be any other electrical connector.

The bottom package 1502 can include a second bottom integrated circuit 1518, which is a semiconductor device. For illustrative purposes, the second bottom integrated circuit 1518 is shown as a wirebond device, although it is understood that the second bottom integrated circuit 1518 can be any other semiconductor device.

The second bottom integrated circuit 1518 can be mounted over the first bottom integrated circuit 1510. The bottom package 1502 can include a second bottom attach layer 1520, which attaches the first bottom integrated circuit 1510 and the second bottom integrated circuit 1518.

The bottom package 1502 can include a second bottom connector 1522, which is an electrical connector. The second bottom connector 1522 can electrically connect the second bottom substrate side 1508 and the second bottom integrated circuit 1518. For illustrative purposes, the second bottom connector 1522 is shown as a bond wire, although it is understood that the second bottom connector 1522 can be any other electrical connector.

The bottom package 1502 can include a bottom encapsulation 1524, which covers a semiconductor package to seal electrical devices providing mechanical and environmental protection. The bottom encapsulation 1524 can be a package cover including an encapsulant or a mold material.

The bottom encapsulation 1524 can be formed over the second bottom substrate side 1508. The bottom encapsulation 1524 can cover the first bottom integrated circuit 1510, the first bottom attach layer 1512, and the first bottom connector 1514. The bottom encapsulation 1524 can also cover the second bottom integrated circuit 1518, the second bottom attach layer 1520, and the second bottom connector 1522.

The bottom package 1502 can include a bottom interconnect 1526. The bottom interconnect 1526 can be formed in a manner similar to the bottom interconnect 126 of FIG. 1.

The integrated circuit packaging system 1500 can include a top package 1528. The top package 1528 can be formed in a manner similar to the top package 128 of FIG. 1. The top package 1528 can include a top substrate 1530 having a first top substrate side 1532 and a second top substrate side 1534.

The top package 1528 can include a first top integrated circuit 1536, a first top attach layer 1538, and a first top connector 1540. The top package 1528 can also include a second top integrated circuit 1542, a second top attach layer 1544, and a second top connector 1546. The top package 1528 can further include a top encapsulation 1548 and a top interconnect 1550.

The top package 1528 can be mounted over the bottom package 1502 in a manner similar to the top package 128, except that the first top substrate side 1532 can be over the bottom encapsulation 1524. The integrated circuit packaging system 1500 can include an underfill layer 1552. The underfill layer 1552 can be formed in a manner similar to the underfill layer 152 of FIG. 1, except that the underfill layer 1552 can be adjacent the bottom encapsulation 1524.

It has been discovered that the present invention provides the underfill layer 1552 to reinforce the top interconnect 1550 in a structure having the bottom package 1502, such as a package-on-package bottom (PoPb) package, with the first bottom integrated circuit 1510 and the second bottom integrated circuit 1518 as wirebond (WB) stack die (SD) devices.

Figure 16:
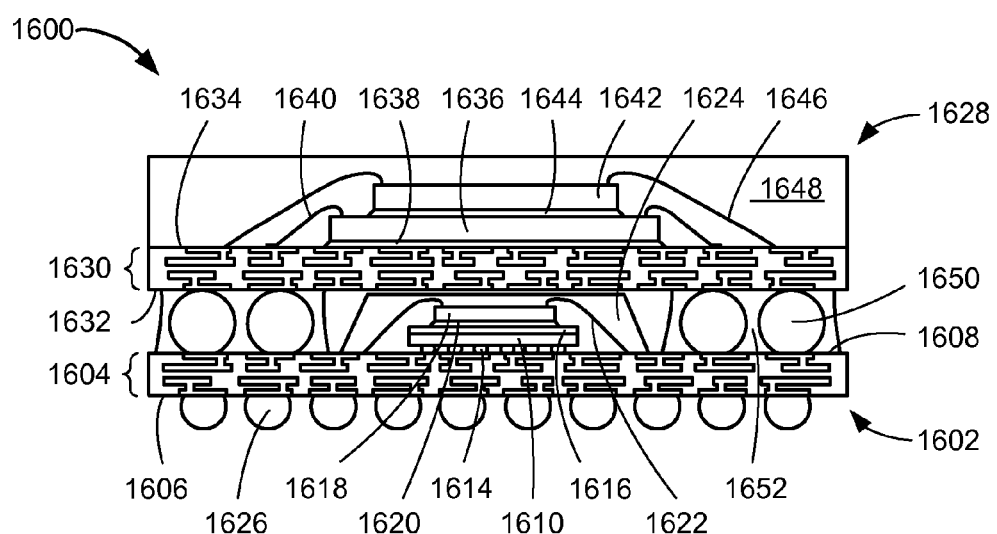
FIG. 16 is a cross-sectional view similar to FIG. 1 of an integrated circuit packaging system in a fourth embodiment of the present invention.

Referring now to FIG. 16, therein is shown a cross-sectional view similar to FIG. 1 of an integrated circuit packaging system 1600 in a fourth embodiment of the present invention. The integrated circuit packaging system 1600 can include a bottom package 1602.

The bottom package 1602 can be formed in a manner similar to the bottom package 102 of FIG. 1, except that the bottom package 1602 can additionally include an attachment layer, another integrated circuit, another connector, and a package cover.

The bottom package 1602 can include a bottom substrate 1604 having a first bottom substrate side 1606 and a second bottom substrate side 1608. The bottom substrate 1604 can be formed in a manner similar to the bottom substrate 104 of FIG. 1.

The bottom package 1602 can include a first bottom integrated circuit 1610, a first bottom connector 1614, and a thermal interface layer 1616. The first bottom integrated circuit 1610, the first bottom connector 1614, and the thermal interface layer 1616 can be formed in a manner similar to the bottom integrated circuit 110 of FIG. 1, the bottom connector 114 of FIG. 1, and the thermal interface layer 116 of FIG. 1, respectively.

The bottom package 1602 can include a second bottom integrated circuit 1618, which is a semiconductor device. For illustrative purposes, the second bottom integrated circuit 1618 is shown as a wirebond device, although it is understood that the second bottom integrated circuit 1618 can be any other semiconductor device.

The second bottom integrated circuit 1618 can be mounted over the first bottom integrated circuit 1610. The bottom package 1602 can include a second bottom attach layer 1620, which attaches the first bottom integrated circuit 1610 and the second bottom integrated circuit 1618.

The bottom package 1602 can include a second bottom connector 1622, which is an electrical connector. The second bottom connector 1622 can electrically connect the second bottom substrate side 1608 and the second bottom integrated circuit 1618. For illustrative purposes, the second bottom connector 1622 is shown as a bond wire, although it is understood that the second bottom connector 1622 can be any other electrical connector.

The bottom package 1602 can include a bottom encapsulation 1624, which covers a semiconductor package to seal electrical devices providing mechanical and environmental protection. The bottom encapsulation 1624 can be a package cover including an encapsulant or a mold material.

The bottom encapsulation 1624 can be formed over the second bottom substrate side 1608. The bottom encapsulation 1624 can cover the first bottom integrated circuit 1610, the first bottom connector 1614, and the thermal interface layer 1616. The bottom encapsulation 1624 can also cover the second bottom integrated circuit 1618, the second bottom attach layer 1620, and the second bottom connector 1622.

The bottom package 1602 can include a bottom interconnect 1626. The bottom interconnect 1626 can be formed in a manner similar to the bottom interconnect 126 of FIG. 1.

The integrated circuit packaging system 1600 can include a top package 1628. The top package 1628 can be formed in a manner similar to the top package 128 of FIG. 1. The top package 1628 can include a top substrate 1630 having a first top substrate side 1632 and a second top substrate side 1634.

The top package 1628 can include a first top integrated circuit 1636, a first top attach layer 1638, and a first top connector 1640. The top package 1628 can include a second top integrated circuit 1642, a second top attach layer 1644, and a second top connector 1646. The top package 1628 can also include a top encapsulation 1648, and a top interconnect 1650.

The top package 1628 can be mounted over the bottom package 1602 in a manner similar to the top package 128, except that the first top substrate side 1632 can be over the bottom encapsulation 1624. The integrated circuit packaging system 1600 can include an underfill layer 1652. The underfill layer 1652 can be formed in a manner similar to the underfill layer 152 of FIG. 1, except that the underfill layer 1652 can be adjacent the bottom encapsulation 1624.

It has been discovered that the present invention provides the underfill layer 1652 to reinforce the top interconnect 1650 in a structure having the bottom package 1602, such as a package-on-package bottom (PoPb) package, with the first bottom integrated circuit 1610 and the second bottom integrated circuit 1618 as wirebond/flip-chip (WB/FC) stack die (SD) devices.

Figure 17:
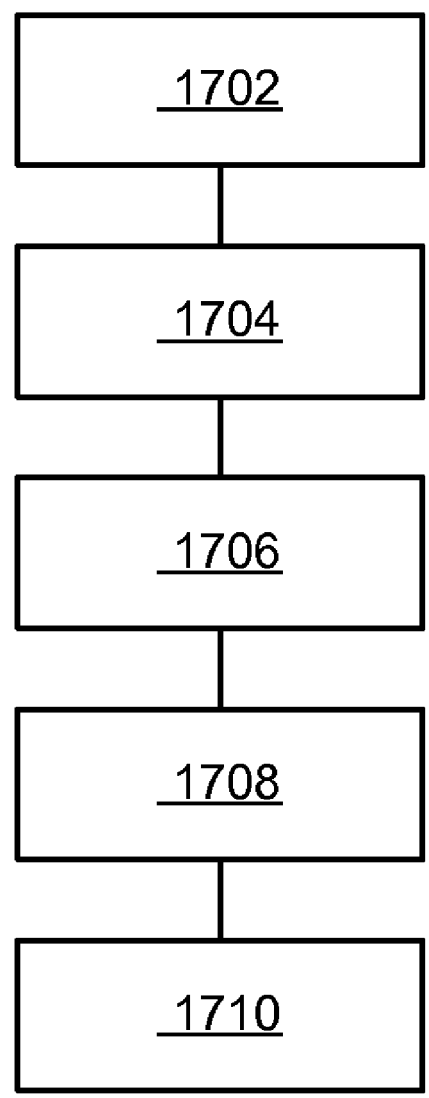
FIG. 17 is a flow chart of a method of manufacture of an integrated circuit packaging system in a further embodiment of the present invention.

Referring now to FIG. 17, therein is shown a flow chart of a method 1700 of manufacture of the integrated circuit packaging system 100 in a further embodiment of the present invention. The method 1700 includes: providing a bottom substrate in a block 1702; mounting a bottom integrated circuit over the bottom substrate in a block 1704; mounting a top substrate over a side of the bottom integrated circuit opposite the bottom substrate in a block 1706; connecting a top interconnect between the bottom substrate and the top substrate in a block 1708; and forming an underfill layer between the bottom substrate and the top substrate, the underfill layer encapsulating the top interconnect outside a perimeter of the bottom integrated circuit in a block 1710.

The present invention can include an integrated circuit packaging system having a structure with the package-on-package top (PoPt) package or the package-on-package bottom (PoPb) package independently selected from either a flip chip package or a plastic encapsulated package.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a bottom substrate and a top substrate;
    mounting a bottom integrated circuit over the bottom substrate;
    forming an underfill material on the bottom substrate or the top substrate;
    forming a patterned underfill by removing a portion of the underfill material;
    mounting a top substrate over a side of the bottom integrated circuit opposite the bottom substrate; and
    connecting a top interconnect between the bottom substrate and the top substrate and encapsulated by the patterned underfill outside a perimeter of the bottom integrated circuit.

2. The method as claimed in claim 1 wherein forming the underfill layer includes forming the underfill layer having thermal conduction.

3. The method as claimed in claim 1 wherein forming the underfill layer includes forming the underfill layer having a discontinuous structure adjacent a side of the top substrate.

4. The method as claimed in claim 1 wherein forming the underfill layer includes forming the underfill layer with a material providing fixed spacing between the bottom substrate and the top substrate.

5. The method as claimed in claim 1 further comprising applying a thermal interface layer directly on the bottom integrated circuit and thermally connected to the bottom integrated circuit and the top substrate.

6. A method of manufacture of an integrated circuit packaging system comprising:
    providing a bottom substrate and a top substrate;
    mounting a bottom integrated circuit over the bottom substrate;
    forming an underfill material on the bottom substrate or the top substrate;
    forming a patterned underfill by removing a portion of the underfill material;
    mounting a top substrate over a side of the bottom integrated circuit opposite the bottom substrate, the top substrate having a periphery; and
    connecting a top interconnect between the bottom substrate and the top substrate and encapsulated by the patterned underfill outside a perimeter of the bottom integrated circuit, the patterned underfill between the periphery and the bottom integrated circuit.

7. The method as claimed in claim 6 further comprising forming a bottom encapsulation over the bottom substrate and covering the bottom integrated circuit, the bottom encapsulation adjacent the underfill layer.

8. The method as claimed in claim 6 further comprising mounting a second bottom integrated circuit over the bottom integrated circuit.

9. The method as claimed in claim 6 wherein mounting the bottom integrated circuit includes mounting a flip chip over the bottom substrate.

10. The method as claimed in claim 6 wherein mounting the bottom integrated circuit includes mounting a wirebond device over the bottom substrate.

11. An integrated circuit packaging system comprising:
    a bottom substrate;
    a bottom integrated circuit over the bottom substrate;
    a top substrate over a side of the bottom integrated circuit opposite the bottom substrate;
    a top interconnect between the bottom substrate and the top substrate; and
    an underfill layer, including a photoimageable material, between the bottom substrate and the top substrate, the underfill layer encapsulating the top interconnect, outside a perimeter of the bottom integrated circuit.

12. The system as claimed in claim 11 wherein the underfill layer has thermal conduction.

13. The system as claimed in claim 11 wherein the underfill layer includes a discontinuous structure adjacent a side of the top substrate.

14. The system as claimed in claim 11 wherein the underfill layer is a material providing fixed spacing between the bottom substrate and the top substrate.

15. The system as claimed in claim 11 further comprising a thermal interface layer directly on the bottom integrated circuit and thermally connected to the bottom integrated circuit and the top substrate.

16. The system as claimed in claim 11 wherein:
    the top substrate includes a periphery; and
    the underfill layer is between the periphery and the bottom integrated circuit.

17. The system as claimed in claim 16 further comprising a bottom encapsulation over the bottom substrate and covering the bottom integrated circuit, the bottom encapsulation adjacent the underfill layer.

18. The system as claimed in claim 16 further comprising a second bottom integrated circuit over the bottom integrated circuit.

19. The system as claimed in claim 16 wherein the bottom integrated circuit is a flip chip over the bottom substrate.

20. The system as claimed in claim 16 wherein the bottom integrated circuit is a wirebond device over the bottom substrate.

* * * * *